United States Patent
Kato et al.

(10) Patent No.: US 8,623,146 B2
(45) Date of Patent: Jan. 7, 2014

(54) SUBSTRATE PROCESSING METHOD AND SUBSTRATE PROCESSING APPARATUS

(75) Inventors: Masahiko Kato, Kyoto (JP); Naozumi Fujiwara, Kyoto (JP); Katsuhiko Miya, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 169 days.

(21) Appl. No.: 13/353,883

(22) Filed: Jan. 19, 2012

(65) Prior Publication Data
US 2012/0186275 A1     Jul. 26, 2012

(30) Foreign Application Priority Data
Jan. 20, 2011 (JP) ................................. 2011-009906

(51) Int. Cl.
 B08B 7/04   (2006.01)
 B08B 5/00   (2006.01)
 B08B 3/10   (2006.01)

(52) U.S. Cl.
 USPC .......... 134/4; 34/286; 34/393; 134/5; 134/198

(58) Field of Classification Search
 USPC ............................ 134/4, 5, 198; 34/286, 393
 See application file for complete search history.

(56) References Cited

U.S. PATENT DOCUMENTS

| 4,817,652 A | 4/1989 | Liu et al. |
| 4,962,776 A | 10/1990 | Liu et al. |
| 5,857,474 A | 1/1999 | Sakai et al. |
| 6,783,599 B2 | 8/2004 | Gale et al. |
| 7,823,597 B2 * | 11/2010 | Miya .............................. 134/105 |
| 7,867,337 B2 * | 1/2011 | Izumi ................................. 134/4 |
| 7,942,976 B2 * | 5/2011 | Miya et al. ......................... 134/4 |
| 8,029,622 B2 * | 10/2011 | Miya et al. ......................... 134/4 |
| 2006/0130886 A1 * | 6/2006 | Tada et al. ..................... 134/198 |
| 2007/0131246 A1 * | 6/2007 | Izumi ............................. 134/1.3 |
| 2007/0235062 A1 * | 10/2007 | Fujiwara et al. ................... 134/4 |
| 2008/0060686 A1 | 3/2008 | Miya et al. |
| 2008/0121251 A1 * | 5/2008 | Miya et al. ......................... 134/4 |
| 2008/0121252 A1 * | 5/2008 | Miya ................................. 134/4 |
| 2008/0127508 A1 | 6/2008 | Ohno et al. |
| 2010/0313915 A1 | 12/2010 | Fujiwara et al. |
| 2012/0175819 A1 * | 7/2012 | Miya et al. ..................... 264/334 |
| 2013/0068257 A1 * | 3/2013 | Tomita et al. .................... 134/19 |

FOREIGN PATENT DOCUMENTS

| EP | 0 423 761 | 4/1991 |
| JP | 62-169420 | 7/1987 |
| JP | 3-145130 | 6/1991 |

(Continued)

OTHER PUBLICATIONS

Notice of Allowance for corresponding Korean Patent Application No. 10-2011-0093878, dated Apr. 4, 2013.

*Primary Examiner* — Evan Pert
(74) *Attorney, Agent, or Firm* — Ostrolenk Faber LLP

(57) ABSTRACT

A cooling gas discharge nozzle 7 is arranged above an initial position P(Rin) distant from a rotation center P(0) of a substrate W toward the outer edge of the substrate W and supplies a cooling gas to the initial position P(0) of the rotating substrate W to solidify DIW adhering to an initial region including the initial position P(Rin) and the rotation center P(0). Following formation of an initial solidified region FR0, a range to be solidified is spread toward the outer edge of the substrate W and all the DIW (liquid to be solidified) adhering to a substrate surface Wf is solidified to entirely freeze a liquid film LF.

6 Claims, 10 Drawing Sheets

FORMATION OF LIQUID FILM BY COLD WATER

COMPLETE FORMATION OF INITIAL SOLIDIFIED REGION: TIMING TM2

(56) References Cited

FOREIGN PATENT DOCUMENTS

| JP | 3-503975 | 9/1991 |
| JP | 3-261142 | 11/1991 |
| JP | 7-240356 | 9/1995 |
| JP | 10-22245 | 1/1998 |
| JP | 3343013 | 11/2002 |
| JP | 2008-71875 | 3/2008 |
| JP | 2008-130822 | 6/2008 |
| JP | 2008-135535 | 6/2008 |
| JP | 2010-80584 | 4/2010 |
| JP | 2010-80819 | 4/2010 |

* cited by examiner

F I G. 1
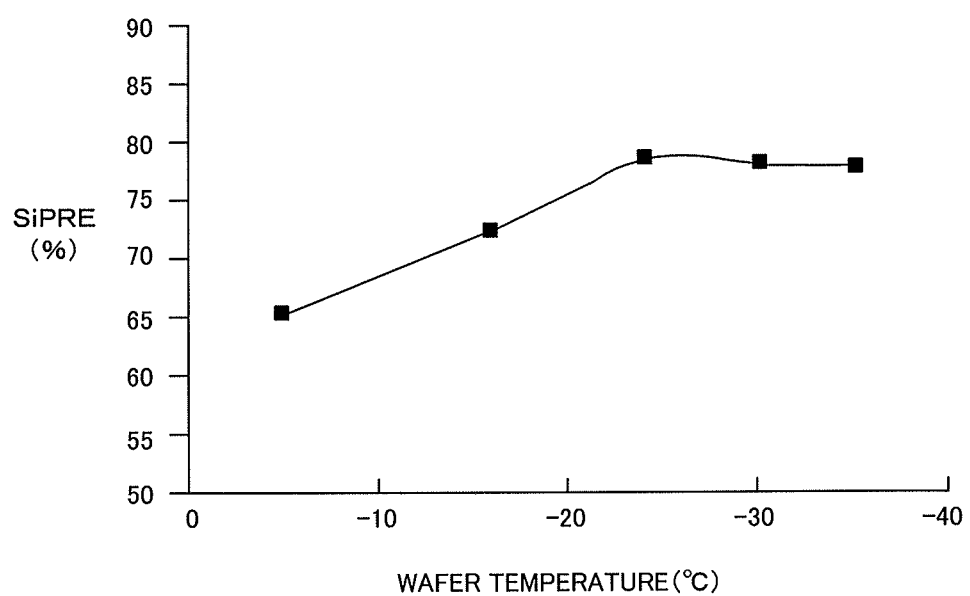

F I G. 4
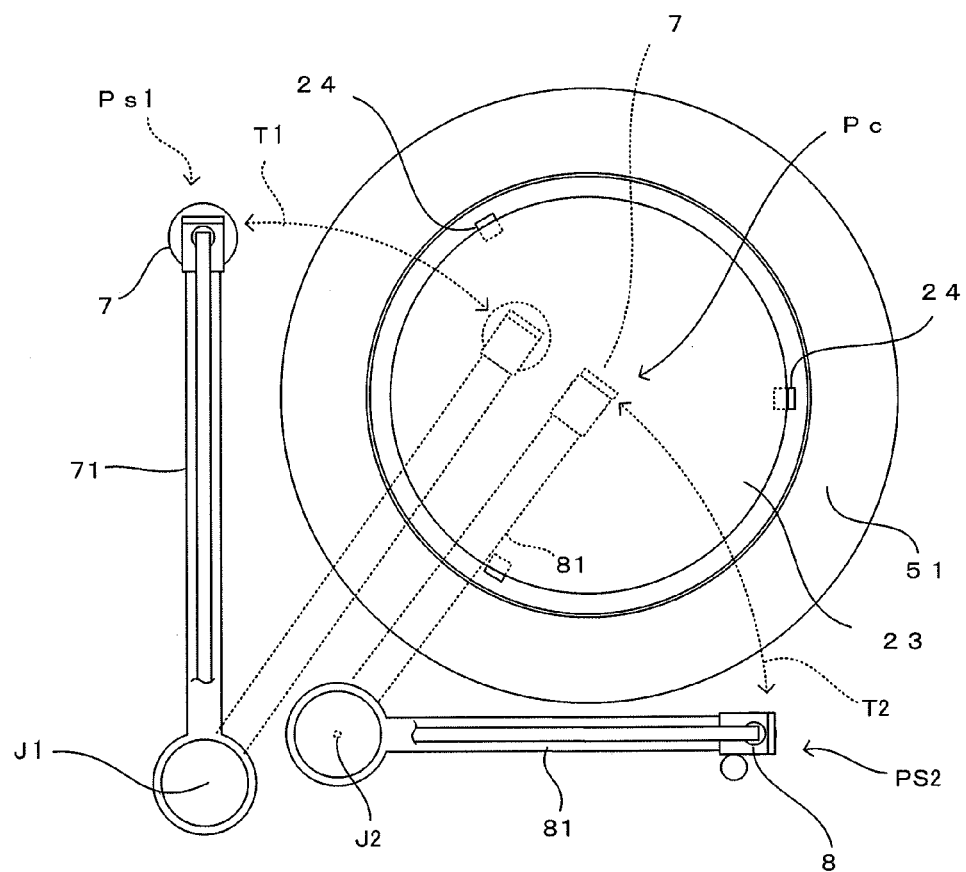

FIG. 5A : FORMATION OF LIQUID FILM BY COLD WATER
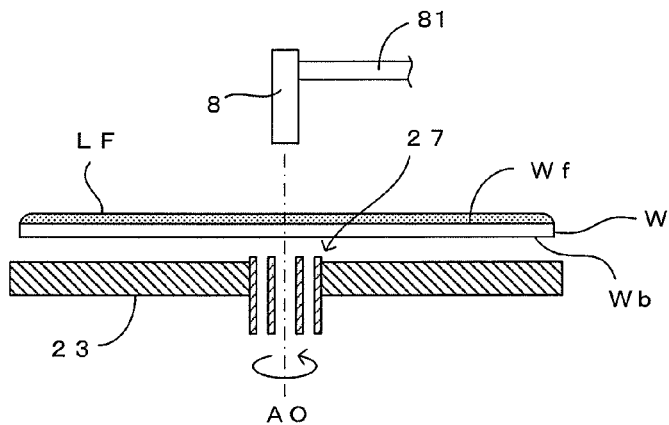
FIG. 5B : SUPPLY OF COOLING GAS TO INITIAL POSITION: TIMING TM1
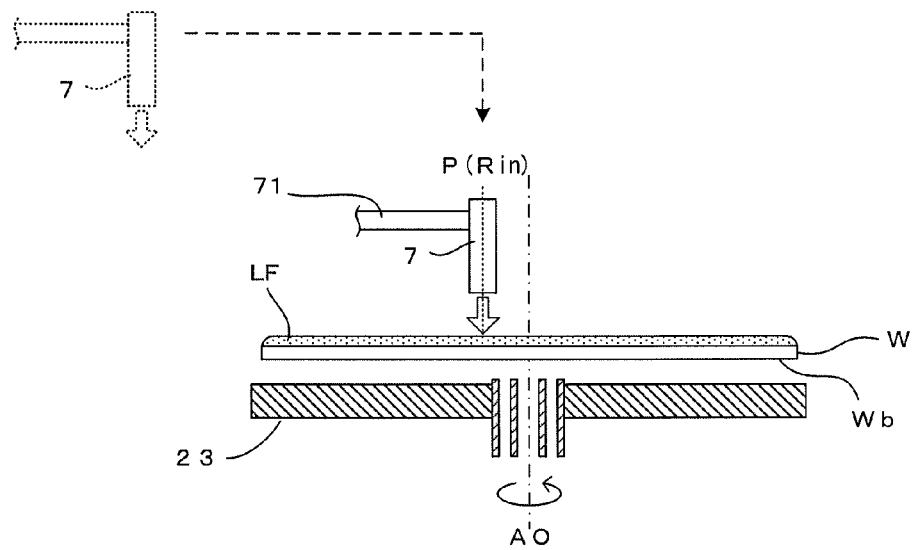
FIG. 5C : COMPLETE FORMATION OF INITIAL SOLIDIFIED REGION: TIMING TM2
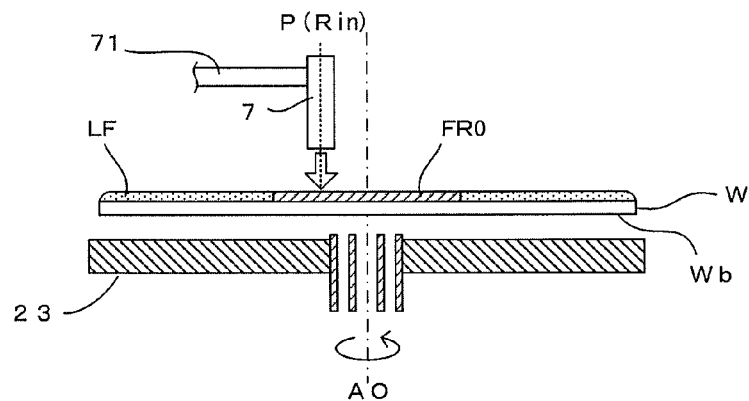

FIG. 6A : MOVE TOWARD OUTER EDGE
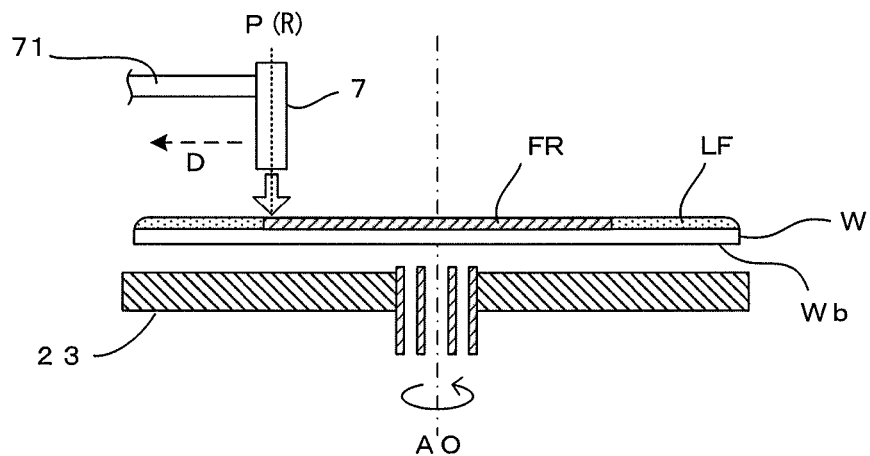
FIG. 6B : COMPLETE FREEZING
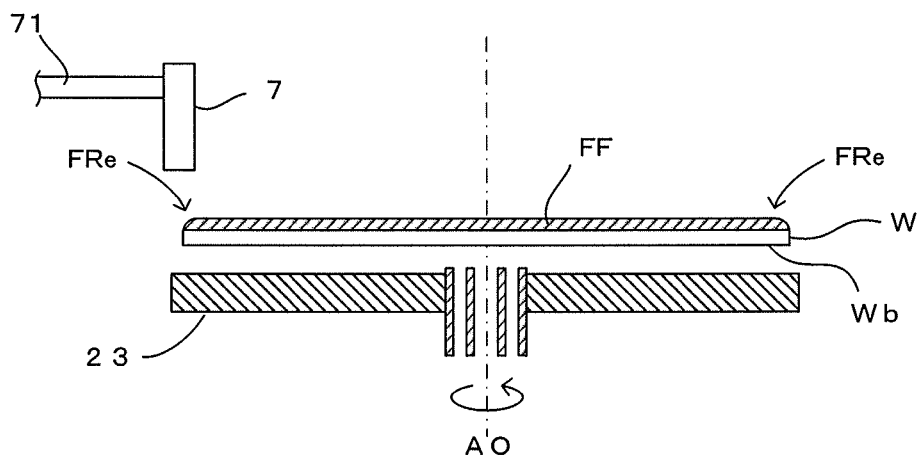

INITIAL POSITION
RIN=0(mm)

INITIAL POSITION
RIN=65(mm)

INITIAL POSITION
RIN=100(mm)

SUBSTRATE PROCESSING METHOD AND SUBSTRATE PROCESSING APPARATUS

CROSS REFERENCE TO RELATED APPLICATION

The disclosure of Japanese Patent Application No. 2011-9906 filed on Jan. 20, 2011 including specification, drawings and claims is incorporated herein by reference in its entirety.

BACKGROUND OF THE INVENTION

1. Field of the Invention

This invention relates to a substrate processing method of and a substrate processing apparatus for removing contaminants such as particles adhering to surfaces of various substrates such as semiconductor wafers, glass substrates for photomasks, glass substrates for liquid crystal displays, glass substrates for plasma displays, and substrates for optical discs.

2. Description of the Related Art

Conventionally, a freeze cleaning technique has been known as one process for removing contaminants such as particles adhering to substrate surfaces. In this technique, after a liquid film formed on a surface of a substrate is frozen, this frozen film is melted and removed to remove particles and the like together with the frozen film from the substrate surface. For example, in the technique disclosed in JP-A-2008-071875, after a liquid film is formed by supplying DIW (deionized water) as a cleaning liquid to a substrate surface, a nozzle for discharging a cooling gas is scanned from a central part to an outer peripheral part of the substrate to freeze the liquid film, and the frozen film is melted and removed by supplying the DIW again, whereby particles are removed from the substrate surface.

SUMMARY OF THE INVENTION

As a result of various experiments, the inventors of this application found out a certain correlation between the temperature of a frozen film and a particle removal rate. The finding is that the particle removal rate can be further improved not only by merely freezing a liquid film, but also by further reducing the temperature of the frozen film. Accordingly, it is advantageous in improving the particle removal rate to reduce the temperature of the frozen film and improvements of liquid film cooling conditions such as a reduction in the temperature of a cooling gas are being studied.

However, since the nozzle is scanned from the central part to the outer peripheral part of the substrate as described above in an apparatus disclosed in JP-A-2008-071875, a cooling gas supply time per unit area is shorter near the outer edge than in the central part of the substrate and the temperature of the frozen film near the outer edge is not reduced as compared to the central part of the substrate. Thus, the temperature of the frozen film becomes nonuniform between the central part and the vicinity of the outer edge of the substrate, with the result that there has been a problem of impairing in-plane uniformity of the removal rate.

Accordingly, to solve such a problem, it is thought to extend the cooling time near the outer edge, for example, by suppressing a nozzle moving speed near the outer edge. However, extended time makes a total time required for a freeze cleaning process of the substrate longer, which leads to a reduction in throughput.

This invention was developed in view of the above problem and an object thereof is to provide a technique capable of removing particles and the like with excellent in-plane uniformity without leading to a reduction in throughput in a substrate processing method and a substrate processing apparatus for removing contaminants such as particles adhering to a substrate surface.

In an aspect of the invention, a substrate processing method comprises: a solidifying step of solidifying a liquid to be solidified by supplying a cooling gas, which has a temperature lower than a solidification point of the liquid to be solidified, from a nozzle to a surface of a substrate to which the liquid to be solidified is adhering while holding the substrate substantially horizontally and rotating the substrate about a vertical axis; and a melting step of melting and removing the liquid solidified by the solidifying step, wherein the solidifying step includes: an initial solidifying step of supplying the cooling gas from the nozzle, which is arranged above an initial position distant from the rotation center of the substrate toward the outer edge of the substrate, to the initial position so as to solidify the liquid to be solidified in an initial region extending from the initial position to a rotation center of the substrate; and a nozzle moving step of relatively moving the nozzle toward the outer edge of the substrate while supplying the cooling gas from the nozzle after the initial solidifying step.

In another aspect of the invention, a substrate processing apparatus comprises: a substrate holder that holds a substrate, which has a surface to which a liquid to be solidified is adhering, substantially horizontally; a rotator that rotates the substrate held by the substrate holder about a vertical axis; a cooling gas supplier including a nozzle relatively movable along the surface of the substrate above the surface of the substrate held by the substrate holder and adapted to supply a cooling gas having a temperature than a solidification point of the liquid to be solidified from the nozzle to the surface of the substrate; and a mover that relatively moves the nozzle along the surface of the substrate; wherein: the mover relatively moves the nozzle toward the outer edge of the substrate after arranging the nozzle above an initial position distant from a rotation center of the substrate toward the outer edge of the substrate; and the cooling gas supplier solidifies the liquid to be solidified in an initial region, which extends from the initial position to the rotation center of the substrate, by supplying the cooling gas from the nozzle arranged above the initial position before a relative movement of the nozzle from a position above the initial position toward the outer edge of the substrate is started, and solidifies the liquid to be solidified outside the initial region by supplying the cooling gas from the nozzle after the relative movement of the nozzle toward the outer edge of the substrate is started.

According to the invention, the nozzle is relatively moved toward the outer edge of the substrate to solidify all the liquid to be solidified adhering to the surface of the substrate after the liquid to be solidified adhering to the initial region is solidified by supplying the cooling gas to the initial position from the nozzle arranged above the initial position distant from the rotation center of the substrate toward the outer edge of the substrate. Thus, the end-point temperature of the solidified liquid can be made uniform and particles and the like can be removed with excellent in-plane uniformity without leading to a reduction in throughput.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTIONS OF THE DRAWINGS

FIG. 1 is a graph showing a relationship between liquid film temperature and particle removal efficiency in the freeze cleaning technique;

FIG. 4 is a diagram showing movement modes of arms in the substrate processing apparatus of FIG. 2;

FIGS. 5A to 5C, 6A and 6B are views diagrammatically showing operations of the substrate processing apparatus of FIG. 2;

DETAILED DESCRIPTION OF THE PREFERRED EMBODIMENTS

Figure 2:
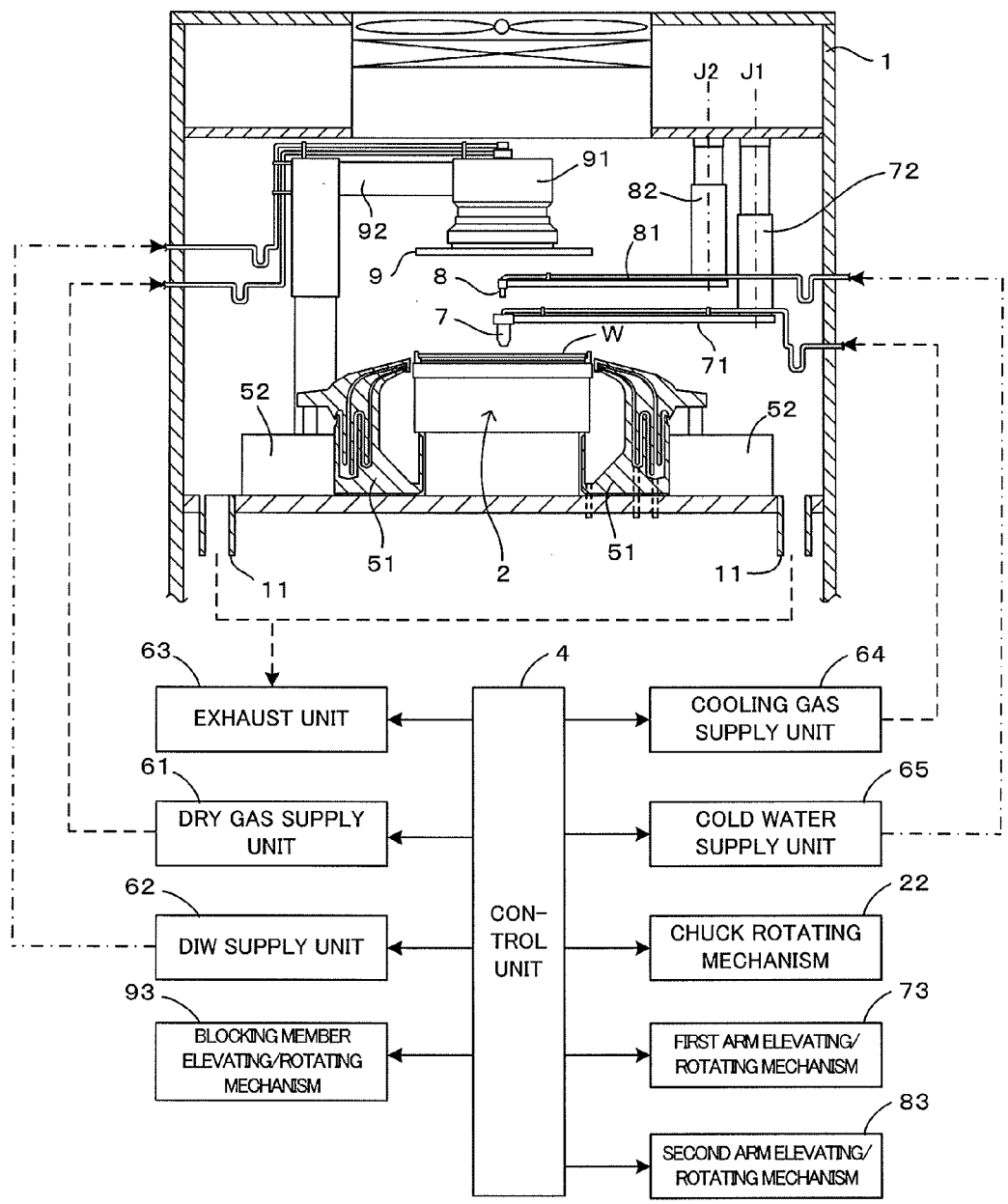
FIG. 2 is a diagram showing one embodiment of a substrate processing apparatus according to this invention.

<Relationship Between Liquid Film Temperature and Particle Removal Efficiency>

Although a liquid film is frozen in the conventional freeze cleaning technique, much consideration has not been given to liquid film temperature after freezing. However, according to an experiment by the inventors of this application using a liquid film by DIW (liquid to be solidified), it was elucidated that particle removal efficiency was improved not only by merely freezing the liquid film, but also as the end-point temperature of the liquid film after freezing decreased as shown in FIG. 1. Note that the temperature of the liquid film before freezing and the temperature of a solidified body obtained by freezing the liquid film are collectively referred to as the "temperature of the liquid film" in this specification.

FIG. 1 is a graph showing a relationship between liquid film temperature and particle removal efficiency in the so-called freeze cleaning technique and specifically showing a result obtained by the following experiment. In this experiment, bare (state where no pattern is formed) Si wafers (wafer diameter: 300 millimeter) are selected as a representative example of substrates. Further, evaluation is made for a case where substrate surfaces are contaminated by Si debris (particle diameter: 0.08 micrometer or larger) as particles.

First, wafers are forcibly contaminated using a single-substrate processing apparatus (Spin Processor SS-3000 produced by Dai Nippon Screen MFG Co., Ltd.). Specifically, a dispersion liquid in which particles (Si debris) are dispersed is supplied to the wafers from a nozzle arranged to face the wafers while the wafers are rotated. Here, the amount of the dispersion liquid, the number of rotations of the wafer and a processing time are appropriately so adjusted that the number of particles adhering to the wafer surface is about 10000. Thereafter, the number (initial value) of the particles adhering to the wafer surface is measured. Note that the number of the particles is measured for an area of the wafer excluding a 3 mm-peripheral area from the outer periphery (edge cut) using a wafer inspection equipment SP1 produced by KLA-Tencor.

Subsequently, the following cleaning process is performed on each wafer. First, DIW temperature-regulated to 0.5 degrees Celsius is discharged for 6 seconds to the wafer rotating at 150 rpm to cool the wafer. Thereafter, the discharge of the DIW is stopped and the number of rotations of the wafer is maintained for 2 seconds, whereby redundant DIW is spun off to form a liquid film. After formation of the liquid film, the number of rotations of the wafer is reduced to 50 rpm and a nitrogen gas of −190 degrees Celsius is discharged to the wafer surface at a flow rate of 90 [L/min] by a scan nozzle while the number of rotations of the wafer is maintained. The nozzle is scanned back and forth between the center and the end of the wafer for 20 seconds. Black rectangles in FIG. 1 correspond to the numbers of scans, and the result up to five scans is shown in FIG. 1 with the leftmost black rectangle representing one scan, the second leftmost one representing two scans, and so forth. By changing the number of scans in this way, a temperature after freezing is changed.

After the above cooling is finished, the number of rotations of the wafer is set to 2000 rpm and DIW temperature-regulated to 80 degrees Celsius is discharged at a flow rate of 4.0 [L/min] for 2 seconds. Thereafter, the number of rotations of the wafer is set to 500 rpm and normal-temperature DIW as a rinsing liquid is supplied at a flow rate of 1.5 [L/min] for 30 seconds to rinse the wafer. Thereafter, the wafer is spin-dried by being rotated at a high speed.

The number of particles adhering to the wafer surface having a series of cleaning processes performed thereon in this way is measured. Then, a removal rate is calculated by comparing the number of particles after freeze cleaning and the initial number of particles measured earlier (before the freeze cleaning process). The graph shown in FIG. 1 is obtained by plotting data obtained in this way.

As is clear from FIG. 1, the particle removal efficiency is improved not only by merely freezing the liquid film, but also as the end-point temperature of the liquid film after freezing decreases. That is, a cleaning effect can be improved by, after the DIW liquid film on the substrate is frozen by the cooling gas, further cooling the frozen liquid film (solidified body) to reduce the final end-point temperature. Further, to ensure in-plane uniformity of the particle removal efficiency, it is important to make the end-point temperature of the liquid film after freezing substantially equal between the central part and the vicinity of the outer edge of the wafer.

Here, the entire liquid film can be cooled to have a uniform end-point temperature by repeating the back-and-forth scan movement between the center and the end of the wafer as in the above experiment. However, since repetition of the scan movement leads to a reduction in throughput, the liquid film needs to be normally frozen by one scan movement as disclosed, for example, in JP-A-2008-071875. That is, it is required to form a solidified body with a uniform end-point temperature for a short period of time by one scan movement. Accordingly, in the following embodiment, after a nozzle is first arranged at a position shifted toward the outer edge of a wafer from a position above a rotation center of the wafer and a liquid to be solidified in a given area is solidified, the nozzle is relatively moved toward the outer edge, whereby a solidification range spreads outward from the center of the wafer to achieve the above object. Hereinafter, the embodiment will be described in detail with reference to the drawings.

<Embodiment>

Figure 3:
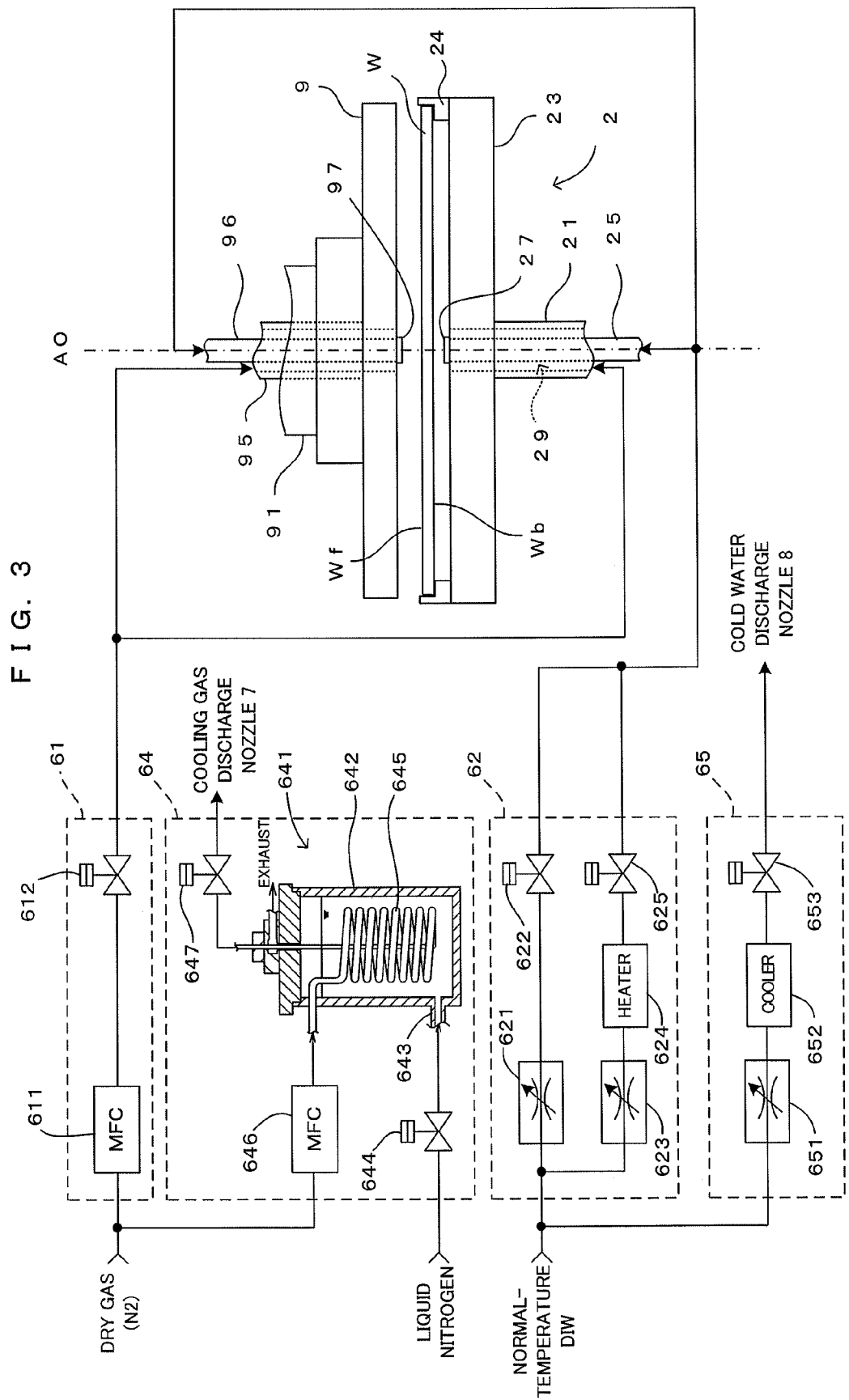
FIG. 3 is a diagram showing supply modes of a nitrogen gas and DIW in the substrate processing apparatus of FIG. 2.
Figure 7A:
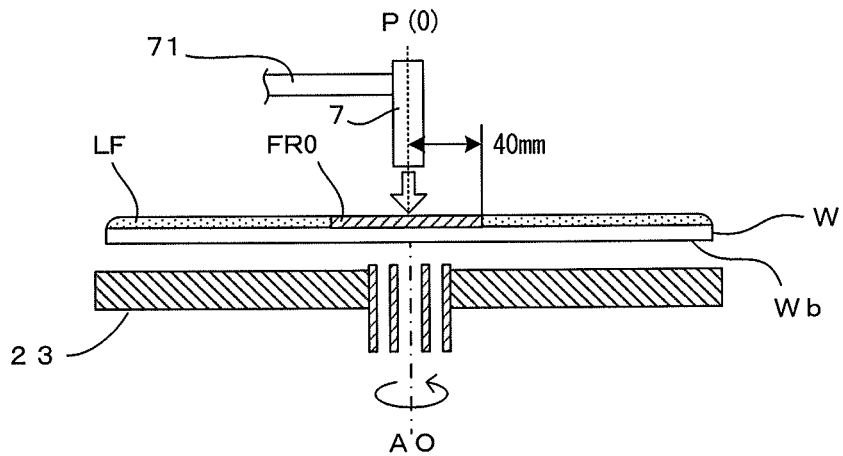
FIGS. 7A to 7C, 8A to 8C are views relationships between initial positions and initial solidified regions.
Figure 7B:
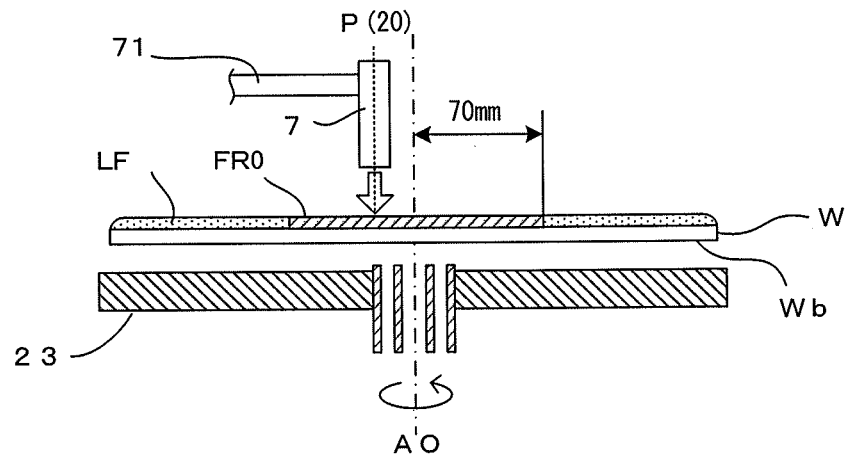
Figure 7C:
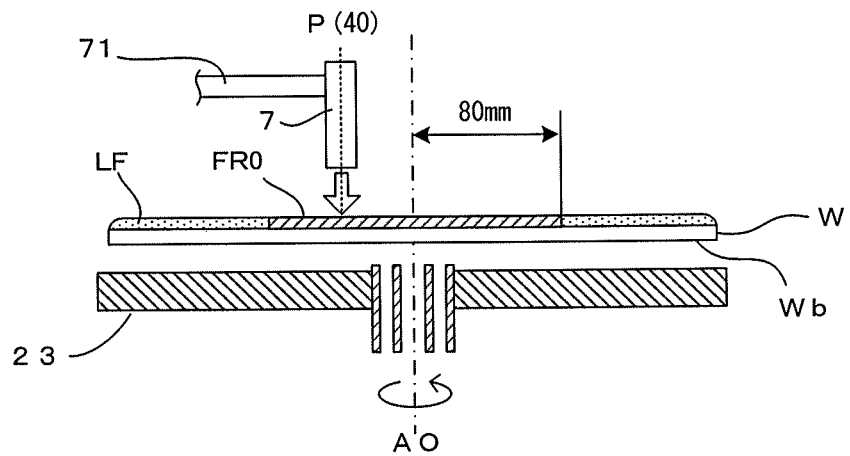

FIG. 2 is a diagram showing one embodiment of a substrate processing apparatus according to this invention. FIG. 3 is a diagram showing supply modes of a nitrogen gas and DIW in the substrate processing apparatus of FIG. 2. FIG. 4 is a diagram showing movement modes of arms in the substrate processing apparatus of FIG. 2. This apparatus is a single-substrate processing apparatus capable of performing a substrate cleaning process to remove contaminants such as particles adhering to a surface Wf of a substrate W such as a semiconductor wafer. More specifically, the substrate processing apparatus performs a freeze cleaning process for, after forming a liquid film on a substrate surface Wf formed with a fine pattern and forming a solidified film (solidified body) by freezing the liquid film, melting and removing the solidified film to remove the particles and the like from the substrate surface Wf together with the solidified film. The freeze cleaning technique is not described in detail in this specification since it is disclosed in many known literatures including JP-A-2008-071875 described above.

This substrate processing apparatus includes a processing chamber 1, and a spin chuck 2 for rotating the substrate W held in a substantially horizontal posture with the surface Wf thereof faced upward in this processing chamber 1. As shown in FIG. 3, a disk-shaped spin base 23 is fixed to the upper end of a center shaft 21 of this spin chuck 2 by a fastening part such as a screw. This center shaft 21 is coupled to a rotary shaft of a chuck rotating mechanism 22 including a motor. When the chuck rotating mechanism 22 is driven in response to an operation command from a control unit 4 for controlling the entire apparatus, the spin base 23 fixed to the center shaft 21 rotates about a central axis of rotation AO.

A plurality of chuck pins 24 for gripping a peripheral edge part of the substrate W stand near a peripheral edge part of the spin base 23. Three or more chuck pins 24 may be provided to reliably hold the circular substrate W. The chuck pins 24 may be arranged at equal angular intervals along the peripheral edge part of the spin base 23. Each of the chuck pins 24 includes a substrate supporting part for supporting the peripheral edge part of the substrate W from below and a substrate holding part for holding the substrate by pressing the outer peripheral end surface of the substrate W supported on the substrate supporting part. Each chuck pin 24 can be switched between a pressing state where the substrate holding part presses the outer peripheral end surface of the substrate W and a releasing state where the substrate holding part is separated from the outer peripheral end surface of the substrate W.

The respective chuck pins 24 are set in the releasing state when the substrate W is transferred to the spin base 23 while being set in the pressing state when a cleaning process is performed on the substrate W. When being set in the pressing state, the respective chuck pins 24 grip the peripheral edge part of the substrate W and the substrate W is held in the substantially horizontal posture while being spaced apart from the spin base 23 by a predetermined distance. In this way, the substrate W is held with its front surface (pattern-formed surface) Wf directed toward above and its back surface Wb toward below.

A blocking member 9 is arranged above the spin chuck 2 constructed as described above. This blocking member 9 is in the form of a circular plate having an opening in a central part. Further, the lower surface of the blocking member 9 is a surface-facing surface facing the surface Wf of the substrate W substantially in parallel and is sized to have a diameter equal to or larger than that of the substrate W. This blocking member 9 is substantially horizontally attached to the lower end of a supporting shaft 91. This supporting shaft 91 is held rotatably about a vertical axis passing through the center of the substrate W by an arm 92 extending in a horizontal direction. Further, a blocking member elevating/rotating mechanism 93 is connected to the arm 92.

The blocking member elevating/rotating mechanism 93 rotates the supporting shaft 91 about the vertical axis passing through the center of the substrate W in response to an operation command from the control unit 4. The control unit 4 controls the movement of the blocking member elevating/rotating mechanism 93 and rotates the blocking member 9 in the same rotational direction and substantially at the same rotational speed as the substrate W according to the rotation of the substrate W held by the spin chuck 2. Further, the blocking member elevating/rotating mechanism 93 moves the blocking member 9 toward and conversely away from the spin base 23 in response to an operation command from the control unit 4. Specifically, the control unit 4 controls the movement of the blocking member elevating/rotating mechanism 93 to lift the blocking member 9 to a separated position (position shown in FIG. 2) above the spin chuck 2 when the substrate W is loaded into and unloaded from the substrate processing apparatus and, on the other hand, lower the blocking member 9 to a facing position set very close to the surface Wf of the substrate W held by the spin chuck 2 when a specified process is performed on the substrate W.

As shown in FIG. 3, the supporting shaft 91 of the blocking member 9 is hollow and a gas supply pipe 95 which is open in the lower surface (substrate-facing surface) of the blocking member 9 is inserted into the supporting shaft 91. This gas supply pipe 95 is connected to a dry gas supply unit 61. This dry gas supply unit 61 is for supplying a nitrogen gas supplied from a nitrogen gas supply source (not shown) to the substrate W and includes a mass flow controller (MFC) 611 and an on-off valve 612. This mass flow controller 611 can regulate the flow rate of the nitrogen gas with high accuracy in response to a flow rate command from the control unit 4. Further, the on-off valve 612 opens and closes in response to opening and closing commands from the control unit 4 to switchingly supply and stop the supply of the nitrogen gas having the flow rate regulated by the mass flow controller 611. Thus, by the control unit 4 controlling the dry gas supply unit 61, the nitrogen gas having the flow rate regulated is supplied as a dry gas for drying the substrate W from the gas supply pipe 95 toward a space formed between the blocking member 9 and the surface Wf of the substrate W at a proper timing. Note that although the nitrogen gas is supplied as the dry gas from the dry gas supply unit 61 in this embodiment, air or another inert gas may be supplied.

A liquid supply pipe 96 is inserted through the interior of the gas supply pipe 95. A lower end part of this liquid supply pipe 96 is open in the lower surface of the blocking member 9, and a liquid discharge nozzle 97 is provided at the leading end of the liquid supply pipe 96. On the other hand, an upper end part of the liquid supply pipe 96 is connected to a DIW supply unit 62. This DIW supply unit 62 is for supplying normal-temperature DIW supplied from a DIW supply source (not shown) as a rinsing liquid and supplying high-temperature DIW heated to about 80 degrees Celsius to the substrate W for a melting and removing process, and is constructed as follows. Here, two pipe lines are provided for the DIW supply source. A flow regulating valve 621 and an on-off valve 622 are inserted in the pipe line for a rinsing process which is one of these pipe lines. The flow regulating valve 621 can regulate the flow rate of the normal-temperature DIW with high accuracy in response to a flow rate command form the control unit 4. Further, the on-off valve 622 opens and closes in response to an opening and closing command from the control unit 4 to switchingly supply and stop the supply of the normal-temperature DIW having the flow rate regulated by the flow regulating valve 621.

A flow regulating valve 623, a heater 624 and an on-off valve 625 are inserted in another pipe line for the melting and removing process. This flow regulating valve 623 regulates the flow rate of the normal-temperature DIW with high accuracy in response to a flow rate command from the control unit 4 and feeds the regulated normal-temperature DIW to the heater 624. The heater 624 heats the fed normal-temperature DIW to about 80 degrees Celsius and the heated DIW (hereinafter, referred to as "high-temperature DIW") is fed out via the on-off valve 625. Note that the on-off valve 625 switchingly supplies and stops the supply of the high-temperature DIW by being opened and closed in response to opening and closing commands from the control unit 4. In this way, the normal-temperature DIW and the high-temperature DIW fed out from the DIW supply unit 62 are discharged from the liquid discharge nozzle 97 toward the surface Wf of the substrate W at proper timings.

The center shaft 21 of the spin chuck 2 has a cylindrical hollow and a cylindrical liquid supply pipe 25 for supplying the rinsing liquid to the back surface Wb of the substrate W is inserted through the interior of the center shaft 21. The liquid supply pipe 25 extends up to a position proximate to the back surface Wb that is the back surface Wb of the substrate W held by the spin chuck 2, and a liquid discharge nozzle 27 for discharging the rinsing liquid toward a central part of the back surface of the substrate W is provided at the leading end of the liquid supply pipe 25. The liquid supply pipe 25 is connected to the DIW supply unit 62 described above and supplies the DIW as the rinsing liquid toward the back surface Wb of the substrate W.

A clearance between the inner wall surface of the center shaft 21 and the outer wall surface of the liquid supply pipe 25 serves as a gas supply path 29 having a ring-shaped cross section. This gas supply path 29 is connected to the dry gas supply unit 61 and the nitrogen gas is supplied from the dry gas supply unit 61 to a space formed between the spin base 23 and the back surface Wb of the substrate W via the gas supply path 29.

As shown in FIG. 2, in this embodiment, a splash guard 51 is so provided around the spin chuck 2 movably upward and downward relative to the rotary shaft of the spin chuck 2 as to surround around the substrate W held in the horizontal posture by the spin chuck 2. This splash guard 51 is shaped to be rotationally symmetrical with respect to the rotary shaft. By moving the splash guide 51 upward and downward in a stepwise manner by driving a guard elevating mechanism 52, the DIW for forming the liquid film, the rinsing liquid, and other processing liquids supplied to the substrate W for other purposes that fly apart from the rotating substrate W can be sorted out and discharged to unillustrated discharged liquid processing units from the interior of the processing chamber 1.

A plurality of exhaust ports 11 are provided at a bottom surface part of this processing chamber 1, and the internal space of the processing chamber 1 is connected to an exhaust unit 63 via these exhaust ports 11. This exhaust unit 63 includes an exhaust damper and an exhaust pump and the amount of exhaust by the exhaust unit 63 can be regulated by controlling a degree of opening of the exhaust damper. The control unit 4 gives a command concerning the amount of opening of the exhaust damper to the exhaust unit 63 to regulate the amount of exhaust from the processing chamber 1 and control temperature and humidity in the internal space.

In this substrate processing apparatus, a cooling gas discharge nozzle 7 is so provided as to be able to discharge a cooling gas for freezing the liquid film toward the surface Wf of the substrate W held by the spin chuck 2. That is, the cooling gas discharge nozzle 7 is connected to a cooling gas supply unit 64 constructed as follows. As shown in FIG. 3, the cooling gas supply unit 64 includes a heat exchanger 641. A container 642 of the heat exchanger 641 is in the form of a tank which stores liquid nitrogen inside and is made of a material which can withstand liquid nitrogen temperature, e.g. glass, quartz or HDPE (High Density Polyethylene). Note that a double structure covering the container 642 by a heat insulating container may be adopted. In this case, the outer container is preferably made of a material having high heat insulation, e.g. foamable resin or PVC (Polyvinyl Chloride) to suppress heat transfer between atmosphere outside the processing chamber and the container 642.

The container 642 includes a liquid nitrogen feed port 643 through which the liquid nitrogen is introduced. This liquid nitrogen feed port 643 is connected to a liquid nitrogen supply source (not shown) via an on-off valve 644 and the liquid nitrogen fed out from the liquid nitrogen supply source is introduced into the container 642 when the on-off valve 644 is opened in response to an opening command from the control unit 4. Further, a liquid level sensor (not shown) is provided in the container 642, a detection result by this liquid level sensor is input to the control unit 4 and the opening and closing of the on-off valve 644 are controlled by a feedback control by the control unit 4 so that the liquid level of the liquid nitrogen in the container 642 can be controlled with high accuracy. Note that, in this embodiment, the feedback control is so executed that the liquid level of the liquid nitrogen becomes constant, whereby the temperature of the cooling gas is stabilized.

A coil-shaped heat exchanger pipe 645 made of metal such as stainless steel or copper is provided as a gas feed path in the container 642. The heat exchanger pipe 645 is immersed in the liquid nitrogen stored in the container 642, and one end thereof is connected to a nitrogen gas supply source (not shown) via a mass flow controller (MFC) 646 so that the nitrogen gas is supplied from the nitrogen gas supply source. This causes the nitrogen gas to be cooled to a temperature lower than a solidification point (freezing point) of the DIW by the liquid nitrogen in the heat exchanger 641 and to be fed out as a cooling gas from the other end of the heat exchanger pipe 645 to the cooling gas discharge nozzle 7 via an on-off valve 647.

The cooling gas produced in this way is fed to the cooling gas discharge nozzle 7. The cooling gas discharge nozzle 7 is, as shown in FIG. 2, attached to a leading end part of a horizontally extending first arm 71. A rear end part of this first arm 71 is supported rotatably about a central axis of rotation J1 by a rotary shaft 72 hanging down from a ceiling part of the processing chamber 1. A first arm elevating/rotating mechanism 73 is coupled to the rotary shaft 72, and the rotary shaft 72 is driven and rotated about the central axis of rotation J1 and driven and moved upward and downward in response to an operation command from the control unit 4. As a result, the cooling gas discharge nozzle 7 attached to the leading end part of the first arm 71 moves above the substrate surface Wf as shown in FIG. 4.

In this embodiment, a cold water discharge nozzle 8 is constructed to be movable above the substrate surface Wf similar to the cooling gas discharge nozzle 7. This cold water discharge nozzle 8 supplies a liquid (corresponding to a "liquid to be solidified" of the invention), which will form a liquid film and has a temperature lower than normal temperature, e.g. DIW cooled to, e.g. 0 to 2 degrees Celsius, preferably to about 0.5 degrees Celsius, toward the surface Wf of the substrate W held by the spin chuck 2. That is, the cold water discharge nozzle 8 is connected to a cold water supply unit 65 which cools normal-temperature DIW until about 0.5 degrees Celsius to product cold water and then feeds the cold water to the cold water discharge nozzle 8. Note that this cold water supply unit 65 includes a flow regulating valve 651, a cooler 652 and an on-off valve 653 as shown in FIG. 3. This flow regulating valve 651 feeds the normal-temperature DIW to the cooler 652 while regulating the flow rate thereof with high accuracy in response to a flow rate command from the control unit 4. Then, the cooler 652 cools the fed normal-temperature DIW to about 0.5 degrees Celsius and the cold water (cooled DIW) is fed out via the on-off valve 653.

To rotate the nozzle 8 receiving the supply of the cold water about a central axis of rotation J2 and move it upward and downward, a rear end part of a horizontally extending second arm 81 is supported rotatably about the central axis of rotation J2 by a rotary shaft 82. On the other hand, the cold water discharge nozzle 8 is attached to a leading end part of the second arm 81 with a discharge port (not shown) thereof faced downward. Further, a second arm elevating/rotating mechanism 83 is coupled to the rotary shaft 82, the rotary shaft 82 is driven and rotated about the central axis of rotation J2 and driven and moved upward and downward in response to an operation command from the control unit 4. As a result, the cold water discharge nozzle 8 attached to the leading end part of the second arm 82 moves above the substrate surface Wf as described below.

The cooling gas discharge nozzle 7 and the cold water discharge nozzle 8 can respectively independently move relative to the substrate W. That is, when the first arm elevating/rotating mechanism 73 is driven and the first arm 71 is pivoted about the central axis of rotation J1 as shown in FIG. 4 in response to an operation command from the control unit 4, the cooling gas discharge nozzle 7 attached to the first arm 71 horizontally moves along a movement path T1 between a rotation center position Pc corresponding to a position above the rotation center of the spin base 23 and a standby position Ps1 laterally retracted from a position facing the substrate W. That is, the first arm elevating/rotating mechanism 73 moves the cooling gas discharge nozzle 7 relative to the substrate W along the surface Wf of the substrate W. However, in this embodiment, a movable range of the cooling gas discharge nozzle 7 is narrowed as described later to achieve the object of making the end-point temperature of the frozen liquid film uniform and improve throughput.

Further, when the second arm elevating/rotating mechanism 83 is driven and the second arm 81 is pivoted about the central axis of rotation J2 in response to an operation command from the control unit 4, the cold water discharge nozzle 8 attached to the second arm 81 horizontally moves along a movement path T2 between a standby position Ps2 different from the standby position Ps1 of the first arm 71 and the rotation center position Pc. That is, the second arm elevating/rotating mechanism 83 moves the cold water discharge nozzle 8 relative to the substrate W along the surface Wf of the substrate W.

FIGS. 5A to 5C, 6A and 6B are views diagrammatically showing operations of the substrate processing apparatus of FIG. 2. In this apparatus, when an unprocessed substrate W is loaded into the apparatus, the control unit 4 controls the respective parts of the apparatus to perform a series of cleaning processes on the substrate W. Here, the substrate W is loaded into the processing chamber 1 with the surface Wf thereof faced upward beforehand and held by the spin chuck 2, whereas the blocking member 9 is retracted to an upper position where it does not interfere with the arms 71, 81 while the back surface thereof is held facing the substrate W as shown in FIG. 2.

After loading of the substrate W, the control unit 4 drives the chuck rotating mechanism 22 to rotate the spin chuck 2 and drives the second arm elevating/rotating mechanism 83 to move and position the second arm 81 to the rotation center position Pc. In this way, the cold water discharge nozzle 8 is positioned above the rotation center of the substrate surface Wf, i.e. at the rotation center position Pc as shown in FIG. 5A. Then, the control unit 4 opens the on-off valve 653 of the cooling gas supply unit 65 to supply the low-temperature DIW to the substrate surface Wf from the cold water discharge nozzle 8. A centrifugal force resulting from the rotation of the substrate W acts on the DIW supplied to the substrate surface Wf, the DIW is uniformly spread radially outwardly of the substrate W, and a part thereof is spun off to the outside of the substrate W. In this way, a liquid film (water film) having a predetermined thickness is formed on the entire substrate surface Wf by controlling the thickness of the liquid film to be uniform over the entire substrate surface Wf. Note that, in forming the liquid film, it is not an essential requirement to spin off a part of the DIW supplied to the substrate surface Wf as described above. For example, the liquid film may be formed on the substrate surface Wf without spinning off the DIW from the substrate W in a state where the rotation of the substrate W is stopped or the substrate W is rotated at a relatively low speed.

In this state, a paddle-shaped liquid film LF having a predetermined thickness is formed on the surface Wf of the substrate W. When formation of the liquid film is finished, the control unit 4 drives the second arm elevating/rotating mechanism 83 to move the second arm 81 to the standby position Psi and cause it to wait. Further, after or simultaneously with the movement of the second arm 81, the control unit 4 controls the cooling gas supply unit 64 and the first arm elevating/rotating mechanism 73 to supply the cooling gas to an initial position of the substrate surface Wf (FIG. 5B). That is, the control unit 4 drives and controls the first arm elevating/rotating mechanism 73 to move the first arm 71 toward a position above a rotation center P(0) of the substrate W, i.e. toward the rotation center position Pc at a position sufficiently higher than the substrate W while controlling the respective parts of the cooling gas supply unit 64 to supply the cooling gas to the initial position of the substrate surface Wf from the cooling gas discharge nozzle 7. Here, the "position sufficiently higher than the substrate W" means such a height that the cooling gas discharged from the nozzle 7 does not affect the substrate W. When the cooling gas discharge nozzle 7 reaches a position above a position P(Rin) short of the rotation center P(0) of the substrate W, the control unit 4 drives and controls the first arm elevating/rotating mechanism 73 to lower the cooling gas discharge nozzle 7 to a position immediately above the position P(Rin) short of the rotation center P(0) of the substrate W. In this way, the cooling gas is supplied to the position P(Rin) of the surface Wf of the rotating substrate W from a timing TM1 on. Note that, in this specification, the rotation center of the substrate W is denoted by "P(0)" and a position at a distance R from the rotation center P(0) of the substrate surface Wf is denoted by "P(R)" to specify the position of the cooling gas discharge nozzle 7. Particularly, the position of the substrate surface Wf corresponding to the position right below the cooling gas discharge nozzle 7 positioned at first as described above is referred to as an "initial position P(Rin)". For example, in the apparatus for processing the substrate W having a diameter of 300 mm, the value of the distance R is between 0 mm and 150 mm. In this embodiment, the distance Rin is set as follows.

$$Wf/2 < Rin < 75 \text{ mm}$$

where W7 denotes a diameter of a gas discharge port (not shown) of the nozzle 7.

The cooling gas supplied to the initial position P(Rin) is not only supplied to the initial position P(Rin), but also spreads along the substrate surface Wf around the initial position P(Rin) and a part thereof reaches as far as the rotation center P(0) of the substrate W, with the result that the DIW adhering to an initial region extending from the initial position P(Rin) to the rotation center P(0) of the substrate W is solidified to form an initial solidified region FR0 (initial solidifying step). Note that it is difficult to immediately form the initial solidified region FR0 even if the cooling gas is supplied to the substrate surface Wf at the timing TM1 by arranging the nozzle 7 at the position right above the initial position P(Rin). Thus, in this embodiment, the nozzle 7 is stopped at the position right above the initial position P(Rin) for a predetermined time $\Delta T1$ (=TM2−TM1). This predetermined time $\Delta T1$ corresponds to a "first time" of the present invention. Further, in freezing the liquid film LF, the control unit 4 controls the mass flow controller 646 of the cooling gas supply unit 64 to suppress the flow rate of the cooling gas (i.e. cooling gas amount per unit time) to a value suitable for freezing of the liquid film LF. Such suppression of the flow rate of the cooling gas prevents the occurrence of a problem that the substrate surface WF is partially dried and exposed and a problem that a film thickness distribution is made non-uniform by wind pressure and uniformity of the process cannot be ensured.

After the elapse of the predetermined time $\Delta T1$ from the above timing TM1, the cooling gas discharge nozzle 7 is moved in a direction D as shown in FIG. 6A, i.e. moved toward an outer edge position of the substrate W while the supply of the cooling gas is continued (nozzle moving step). This causes a solidified region FR, which is solidified, to spread from the initial solidified region FR0 toward the outer edge of the substrate W and the entire liquid film on the substrate surface Wf to be frozen to form the solidified film FF during the scan, for example, as shown in FIG. 6B. The supply of the cooling gas may be stopped when the cooling gas discharge nozzle 7 reaches a position above the outer edge position of the substrate W, but the end-point temperature of a solidified region FRe solidified near the outer edge of the substrate W out of the solidified film FF may be possibly reduced only to about 0 degrees Celsius since the amount of the cooling gas supplied to the vicinity of the outer edge of the substrate W is slightly less than that supplied to a region closer to the rotation center. Accordingly, the supply of the cooling gas may be continued while the cooling gas discharge nozzle 7 stays at the position above the outer edge of the substrate W for a predetermined time $\Delta T2$. Thus, the end-point temperature of the solidified film FF on the entire substrate surface Wf can be made uniform by sufficiently reducing the end-point temperature of the solidified film FRe.

When the solidified film FF is formed by freezing the liquid film LF in this way, the control unit 4 stops the discharge of the cooling gas from the nozzle 7 and moves the first arm 71 to the standby position Ps1 to retract the nozzle 7 from the substrate surface Wf. Thereafter, the blocking member 9 is arranged proximate to the substrate surface Wf and the high-temperature DIW heated to about 80 degrees Celsius is supplied toward the frozen liquid film on the substrate surface Wf from the nozzle 97 provided on the blocking member 9 to thaw and remove the solidified film (solidified body) FF (melting process). Subsequently, the normal-temperature DIW as the rinsing liquid is supplied to the substrate surface Wf to rinse the substrate W.

When the process thus far is performed, the DIW is supplied to the surface of the substrate W in a state where the substrate W is rotating while being sandwiched between the blocking member 9 and the spin base 23. Here, in parallel with the supply of the high-temperature DIW and the normal-temperature DIW to the substrate surface Wf, the high-temperature DIW and the normal-temperature DIW may be supplied also from the nozzle 27. Subsequently, the supply of the DIW to the substrate W is stopped and a spin-drying process for drying the substrate W by high-speed rotation is performed. That is, the substrate W is rotated at a high speed while the nitrogen gas for drying supplied by the dry gas supply unit 61 is discharged from the nozzle 97 provided on the blocking member 9 and the nozzle 27 provided on the spin base 23, whereby the DIW remaining on the substrate W is spun off to dry the substrate W. When the drying process is finished, the already processed substrate W is unloaded to complete the processes for one substrate.

As described above, according to this embodiment, the DIW adhering to the initial region including the initial position P(Rin) and the rotation center P(0) can be solidified by arranging the cooling gas discharge nozzle 7 above the initial position P(Rin) distant from the rotation center P(0) of the substrate W toward the outer edge of the substrate W and supplying the cooling gas to the initial position P(Rin) of the rotating substrate W. For example, after the cooling gas discharge nozzle 7 having an opening of 31 [mm]×46 [mm] as a gas discharge port is positioned above the initial position P(65), i.e. above a position at a distance of 65 [mm] from the rotation center P(0) of the substrate W toward the outer edge, a nitrogen gas of −190 degrees Celsius is supplied to the substrate surface Wf at a flow rate of 90 [L/min] while the nozzle 7 is stayed there for a residence time of 3.4 [sec], whereby the initial solidified region FR0 is formed in a central part of the liquid film LF (initial solidifying step). This initial solidified region FR0 is a region solidified by the cooling gas spreading around the initial position P(65) along the substrate surface Wf and so formed on the substrate surface Wf as to continuously extend from the initial position P(65) to the rotation center P(0). The initial solidified region FR0 has a substantially circular shape centered on the central axis of rotation (vertical axis) AO in a plan view from above. This point is also confirmed in an example to be described later.

Following formation of the initial solidified region FR0 by the supply of the cooling gas, the nozzle 7 is moved from the position above the initial position P(65) to a position above the outer edge part of the substrate W for about 9.4 seconds (nozzle moving step) while supplying the cooling gas from the nozzle 7. This makes a range to be solidified spread from the initial region toward the outer edge of the substrate W, so as that all the DIW (liquid to be solidified) adhering to the substrate surface Wf is solidified to freeze the entire liquid film LF. By setting the position where the cooling gas is first supplied from the nozzle 7 at the side closer to the outer edge than the rotation center P(0) of the substrate W, the end-point temperature of the solidified film (solidified body) FF could be made uniform over the entire surface of the substrate W and in-plane uniformity of the removal rate could be improved. Further, the movable range of the nozzle 7 is narrowed and, as compared with the conventional technique in which the position where the cooling gas is first supplied is set above the rotation center P(0), a time required for the nozzle movement can be shortened and throughput can be increased. Furthermore, by reducing the moving speed of the nozzle 7 by as much as the movable range of the nozzle 7 is narrowed, the cooling gas is supplied to the respective parts of the substrate surface Wf for a longer time and the end-point temperature can be further reduced. In this case, the particle removal rate can be further improved. This point is also confirmed in the example to be described later.

After being moved to a position P(150) near the outer edge of the substrate W, the cooling gas discharge nozzle 7 is caused to stay at this position for the predetermined time $\Delta T2$, e.g. 5.7 [sec] and continues to supply the cooling gas. Thus, the end-point temperature of the solidified region FRe can be sufficiently reduced and the end-point temperature of the solidified film FF on the entire substrate surface Wf becomes uniform to improve the in-plane uniformity of the removal rate.

As described above, in this embodiment, the spin chuck 2 corresponds to a "substrate holder" of the invention, and the chuck rotating mechanism 22 corresponds to a "rotator" of the invention. Further, the cooling gas discharge nozzle 7 and the cooling gas supply unit 64 function as a "cooling gas supplier" of the invention and the first arm 71 and the first arm elevating/rotating mechanism 73 function as a "mover" of the invention.

Note that the invention is not limited to the above embodiment and various changes other than the aforementioned ones can be made without departing from the gist of the invention. For example, in the above embodiment, the position P(65) at a distance of 65 [mm] from the rotation center P(0) of the substrate W toward the outer edge is set as the initial position, and the cooling gas discharge nozzle 7 is arranged above this position to form the initial solidified region FR0 (initial solidifying step). However, the initial position P(Rin) is not limited to this and only has to be closer to the outer edge than the rotation center P(0) of the substrate W and closer to the rotation center of the substrate W than a middle position between the rotation center P(0) of the substrate W and the outer edge P(150) of the substrate W. More preferably, the initial position P(Rin) is closer to the outer edge than a position P(W7/2).

Although the cooling gas discharge nozzle 7 is arranged above the initial position by being moved and relatively moved toward the outer edge of the substrate from the position above the initial position, the substrate W may be moved instead of or together with the cooling gas discharge nozzle 7.

Further, although the liquid film is formed by the DIW in the above embodiment, the liquid for forming the liquid film, i.e. the liquid to be solidified is not limited to this. For example, carbonated water, hydrogenated water, low-concentration (e.g. about 1 ppm) ammonia water, low-concentration hydrochloric acid or the like may be used or a small amount of surfactant may be added to the DIW.

Although the dry gas (nitrogen gas) is supplied to the dry gas supply unit 61 and the cooling gas supply unit 64 from the same nitrogen gas supply source in the above embodiment, it is not limited to the nitrogen gas. For example, the dry gas and the cooling gas may be different types of gases each other.

Further, although the nitrogen gas supply source, the DIW supply source and the liquid nitrogen supply source are all built in the substrate processing apparatus of the above embodiment, these supply sources may be provided outside the apparatus. For example, existing supply sources in a factory may be utilized. Further, if there is an existing facility for cooling these, liquids and gases cooled by this facility may be utilized.

Furthermore, although the substrate processing apparatus of the above embodiment includes the blocking member 9 arranged above and proximate to the substrate W, the invention is also applicable to an apparatus including no blocking member. Further, although the substrate W is held by the chuck pins 24 held in contact with the peripheral edge part of the substrate W in the apparatus of this embodiment, a substrate holding method is not limited to this and the invention can be also applied to an apparatus in which a substrate is held by another method.

In the invention (substrate processing method and substrate processing apparatus) according to the above embodiment, the cooling gas is supplied to the initial position from the nozzle arranged above the initial position distant from the rotation center of the substrate toward the outer edge of the substrate. If the cooling gas is supplied to the initial position of the substrate in this way, it spreads around the initial position along the substrate surface and a part thereof reaches even the rotation center of the substrate. As a result, the liquid to be solidified adhering to the initial region extending from the initial position to the rotation center of the substrate is solidified. When the nozzle is relatively moved toward the outer edge of the substrate thereafter while supplying the cooling gas, the range to be solidified spreads from the initial region toward the outer edge of the substrate and all the liquid to be solidified adhering to the substrate surface is solidified. By setting the position, where the cooling gas is first supplied from the nozzle, at the side closer to the outer edge than the rotation center of the substrate in this way, the temperature of the solidified liquid can be made uniform over the entire surface of the substrate and the in-plane uniformity of the removal rate can be improved. Further, since the movable range of the nozzle is narrower than in the conventional technique, the time required for the nozzle movement is shortened to improve throughput.

Here, merely in terms of narrowing the movable range of the nozzle, it is preferable to set the initial position closer to the outer edge of the substrate. However, if the initial position is too close to the outer edge of the substrate, it is difficult to solidify the liquid to be solidified on the rotation center of the substrate by the first supply of the cooling gas. Thus, as shown in an experimental result to be described later, solidification progresses from the outer edge side toward the rotation center side near the rotation center of the substrate and the temperature of the liquid to be solidified is not made uniform over the entire substrate surface to impair the in-plane uniformity of the removal rate. Therefore, it is preferable to set the initial position in a range where the liquid to be solidified adhering to the initial region can be solidified by the cooling gas supplied from the nozzle arranged above the initial position, e.g. closer to the rotation center of the substrate than the middle position between the rotation center of the substrate and the outer edge of the substrate.

Conversely, if the initial position is too close to the rotation center of the substrate, the temperature at the rotation center is excessively reduced to make the end-point temperature in the substrate surface nonuniform, the nozzle movable range is widened and it becomes difficult to improve throughput similar to the conventional technique. Therefore, a distance from the rotation center of the substrate to the initial position is preferably equal to or larger than half the diameter of the gas discharge port for discharging the cooling gas from the leading end part of the nozzle.

Since it is difficult to solidify the liquid to be solidified in the initial region immediately after the cooling gas is supplied to the initial position from the nozzle arranged above the initial position, a relative movement of the nozzle is preferably started after the elapse of the first time from the supply of the cooling gas to the initial position. Further, by stopping the supply of the cooling gas after the elapse of the second time after the movement of the nozzle to the position above the vicinity of the outer edge of the substrate is completed, the end-point temperature of the liquid solidified near the outer edge of the substrate can be sufficiently reduced. This can further improve temperature uniformity of the liquid to be solidified over the entire substrate surface and the in-plane uniformity of the removal rate.

Next, an example of the invention and comparative examples will be shown. The invention is not limited by the following example and comparative examples and can be, of course, carried out by appropriately making changes within the scope conformable to the gist described above and below and all of such changes are included in the technical scope of the invention.

Figure 8A:
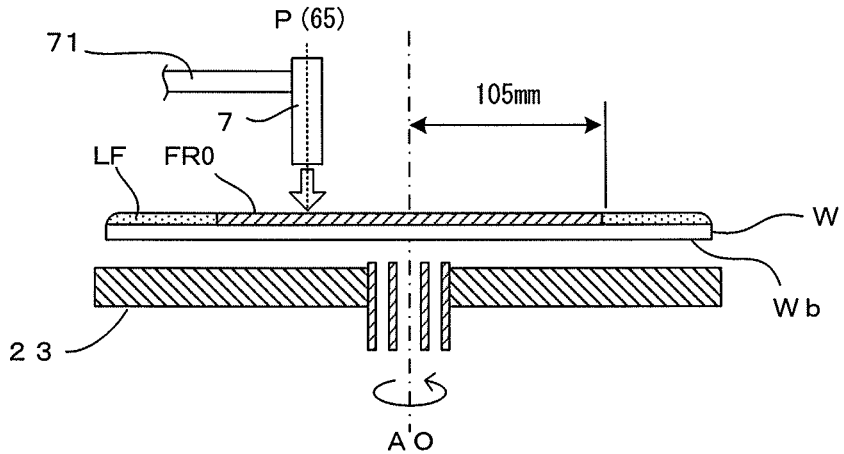
Figure 8B:
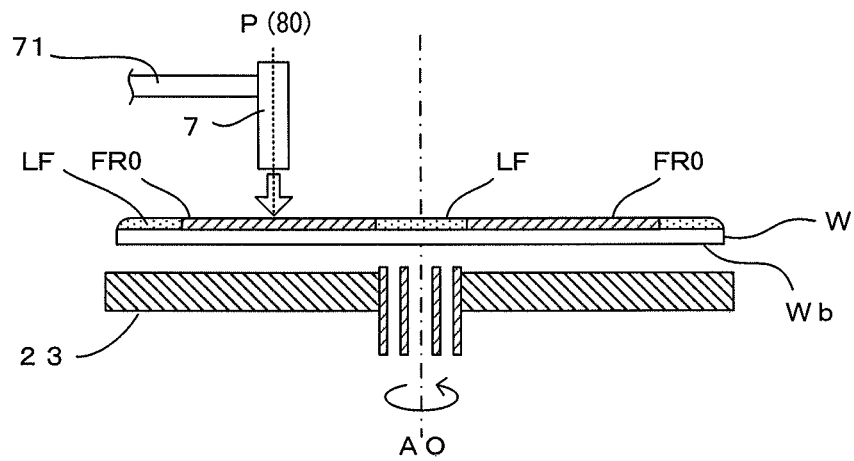
Figure 8C:
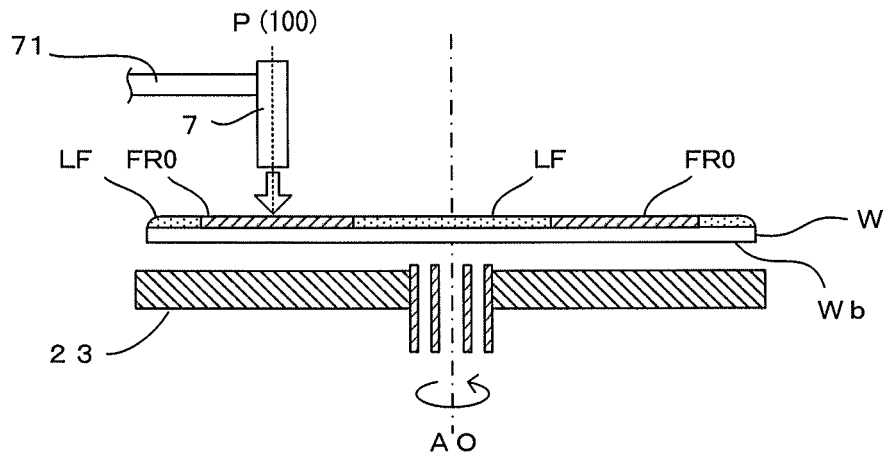

Here, the shape and size of the initial solidified region FR0 were verified while the first position of the cooling gas discharge nozzle 7 was changed as shown in FIGS. 7A to 7C, 8A to 8C. That is, the initial solidified regions FR0 were respectively observed when the cooling gas discharge nozzle 7 was arranged:
above the rotation center P(0) of the substrate W;
above the position P(20) of the substrate W;
above the position P(40) of the substrate W;
above the position P(65) of the substrate W;
above the position P(80) of the substrate W; and
above the position P(100) of the substrate W,
and a nitrogen gas of −190 degrees Celsius was supplied as the cooling gas to the substrate surface Wf at a flow rate of 90 [L/min] while the cooling gas discharge nozzle 7 was caused to stay for 2 seconds. As a result, when the cooling gas discharge nozzle 7 was positioned above the rotation center P(0), the position P(20), the position P(40) and the position P(65) of the substrate W, substantially circular initial solidified regions FR0 including the initial position and having a radius of 40 [mm], 70 [mm], 80 [mm] and 105 [mm] centered on the central axis of rotation (vertical axis) OA of the substrate W in plan views were obtained (FIGS. 7A to 7C, FIG. 8A). When the cooling gas discharge nozzle 7 was moved toward the outer edge of the substrate W while continuing to supply the cooling gas after formation of the initial solidified region FR0, the initial solidified region FR0 spreads from the rotation center side toward the outer edge side and the solidified film FF was formed on the entire substrate surface Wf. On the contrary, when the cooling gas discharge nozzle 7 was positioned above the position P(80) and the position P(100) distant from the above positions toward the outer edge, the liquid film could not be solidified near the rotation center and doughnut-shaped initial solidified regions FR0 in plan views were obtained (FIGS. 8B and 8C). When the cooling gas discharge nozzle 7 was moved toward the outer edge of the substrate W while continuing to supply the cooling gas after formation of the initial solidified region FR0, an outer peripheral side of the initial solidified region FR0 spreads toward the outer edge side and, on the other hand, an inner peripheral side thereof spreads toward the rotation center with a slight delay, whereby the solidified film FF was formed on the entire substrate surface Wf.

Figure 9A:
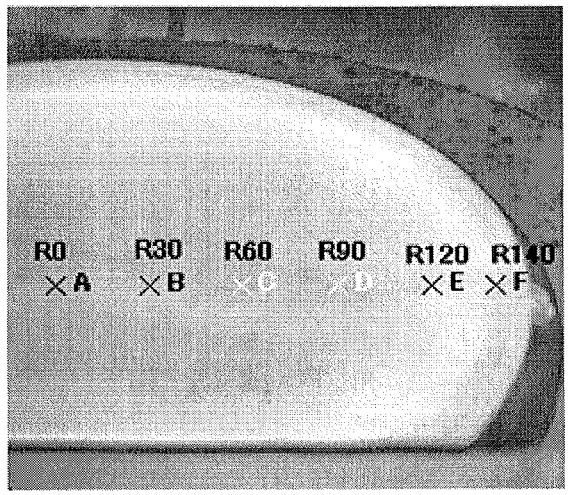
FIGS. 9A to 9C are views showing relationships between the initial positions and end-point temperatures.
Figure 9B:
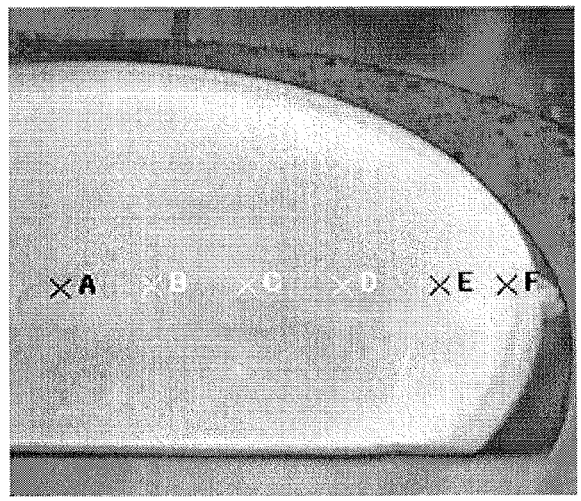
Figure 9C:
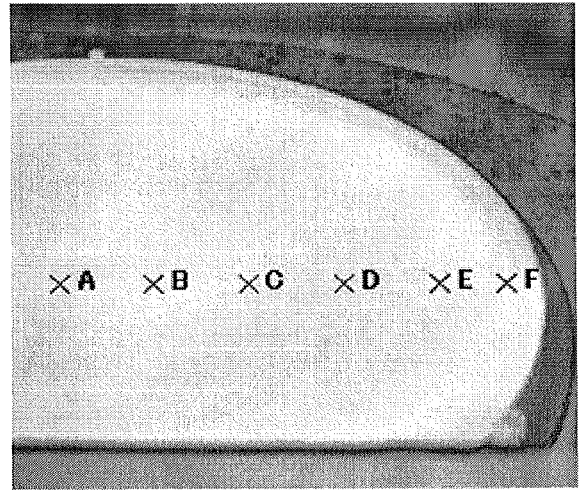

When end-point temperature distributions of the solidified films FF formed on the substrate surfaces Wf were measured for the substrates W on which the initial position P(Rin) was set at the rotation center P(0), the position P(65) and the position (100) out of the substrates W on which the solidified films FF were obtained in this way, a result shown in FIGS. 9A to 9C was obtained. Marks in FIG. 9A, i.e. R0 (X A), R30 (X B), R60 (X C), R90 (X D), R120 (X E) and R140 (X F) respectively indicate surface temperatures at positions at distances of 0 [mm], 30 [mm], 60 [mm], 90 [mm], 120 [mm] and 140 [mm] in a radial direction. As is clear from FIG. 9A, when the initial position P(Rin) was set at the rotation center P(0) of the substrate W, i.e. in the conventional technique, the end-point temperature at the rotation center is drastically lower than those at the other positions, the end-point temperature increases with distance toward the outer edge and the temperature near the outer edge is drastically higher than near the rotation center. Further, when the initial position P(Rin) was set at the position P(100), the end-point temperature is relatively low near the outer edge and drastically higher near the rotation center than near the outer edge. On the contrary, when the initial position P(Rin) was set at the position P(65), the end-point temperature is slightly higher near the outer edge, but relatively equally low in the plane of the substrate surface Wf.

Figure 10:
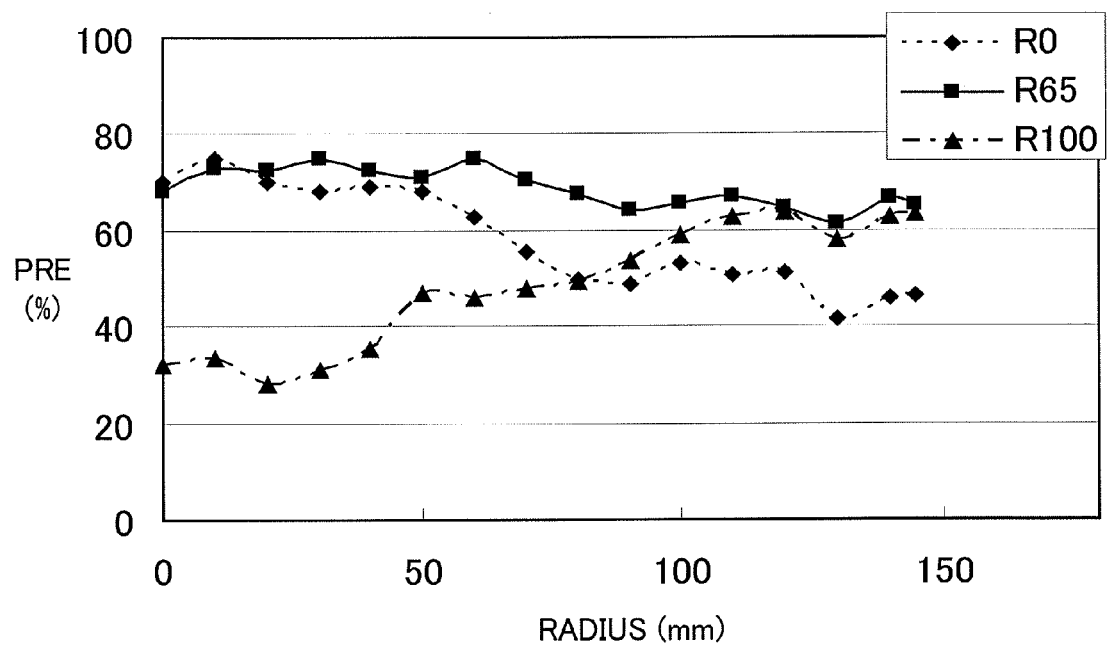
FIG. 10 is a graph showing a relationship between the initial position and an in-plane uniformity of the particle removal efficiency.

After the same melting process, rinsing process and drying process as in the above embodiment were performed for the substrates W having end-point temperature distributions shown in FIGS. 9A to 9C, particle removal rates at respective parts of the respective substrates W were measured to obtain a result shown in FIG. 10. As shown in FIG. 10, when the initial position P(Rin) was set at the rotation center P(0) and the position P(100), the particle removal rate is low near the respective parts where the temperature of the solidified region FF was high and no sufficient in-plane uniformity was obtained. On the contrary, when the initial position P(Rin) was set at the position P(65), a uniform and high particle removal rate was obtained over the entire substrate surface Wf. This coincides with the result of the end-point temperature distribution shown in FIG. 9B.

As described above, particles and the like can be removed with excellent in-plane uniformity by moving the nozzle 7 toward the outer edge while supplying the cooling gas from the nozzle 7 after the initial solidifying step is performed with the nozzle 7 arranged above the initial position distant from the rotation center P(0) of the substrate W toward the outer edge of the substrate W so that the DIW (liquid to be solidified) adhering to the initial region extending from the initial position to the rotation center P(0) of the substrate can be solidified.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:
1. A substrate processing method, comprising:
a solidifying step of solidifying a liquid to be solidified by supplying a cooling gas, which has a temperature lower than a solidification point of the liquid to be solidified, from a nozzle to a surface of a substrate to which the liquid to be solidified is adhering while holding the substrate substantially horizontally and rotating the substrate about a vertical axis; and
a melting step of melting and removing the liquid solidified by the solidifying step, wherein
the solidifying step includes:
an initial solidifying step of supplying the cooling gas from the nozzle, which is arranged above an initial position distant from the rotation center of the substrate toward the outer edge of the substrate, to the initial position so as to solidify the liquid to be solidified in an initial region extending from the initial position to a rotation center of the substrate; and a nozzle moving step of relatively moving the nozzle toward the outer edge of the substrate while supplying the cooling gas from the nozzle after the initial solidifying step.

2. The substrate processing method according to claim 1, wherein:

the initial position is closer to the rotation center of the substrate than a middle position between the rotation center of the substrate and the outer edge of the substrate.

3. The substrate processing method according to claim 1, wherein:

the cooling gas is supplied to the surface of the substrate from a gas discharge port provided at a leading end part of the nozzle in the solidifying step; and a distance from the rotation center of the substrate to the initial position is equal to or larger than half the diameter of the gas discharge port.

4. The substrate processing method according to claim 1, wherein:

a relative movement of the nozzle is started in the solidifying step after the elapse of a first time since the supply of the cooling gas to the initial position.

5. The substrate processing method according to claim 1, wherein:

the supply of the cooling gas is stopped in the solidifying step after the elapse of a second time since a movement of the nozzle to a position above the vicinity of the outer edge of the substrate was completed.

6. A substrate processing apparatus, comprising:

a substrate holder that holds a substrate, which has a surface to which a liquid to be solidified is adhering, substantially horizontally;

a rotator that rotates the substrate held by the substrate holder about a vertical axis;

a cooling gas supplier including a nozzle relatively movable along the surface of the substrate above the surface of the substrate held by the substrate holder and adapted to supply a cooling gas, having a temperature lower than a solidification point of the liquid to be solidified, from the nozzle to the surface of the substrate; and a mover that relatively moves the nozzle along the surface of the substrate; wherein:

the mover relatively moves the nozzle toward the outer edge of the substrate after arranging the nozzle above an initial position distant from a rotation center of the substrate toward the outer edge of the substrate; and the cooling gas supplier solidifies the liquid to be solidified in an initial region, which extends from the initial position to the rotation center of the substrate, by supplying the cooling gas from the nozzle arranged above the initial position before a relative movement of the nozzle from a position above the initial position toward the outer edge of the substrate is started, and solidifies the liquid to be solidified outside the initial region by supplying the cooling gas from the nozzle after the relative movement of the nozzle toward the outer edge of the substrate is started.

* * * * *